(12) United States Patent
Otsuka et al.

(10) Patent No.: US 9,111,061 B2
(45) Date of Patent: Aug. 18, 2015

(54) TRANSISTOR CHARACTERISTIC CALCULATION APPARATUS USING LARGE SIGNAL EQUIVALENT CIRCUIT MODEL

(71) Applicants: Hiroshi Otsuka, Tokyo (JP); Toshiyuki Oishi, Tokyo (JP); Yutaro Yamaguchi, Tokyo (JP); Naoki Kosaka, Tokyo (JP); Shinichi Miwa, Tokyo (JP); Koji Yamanaka, Tokyo (JP)

(72) Inventors: Hiroshi Otsuka, Tokyo (JP); Toshiyuki Oishi, Tokyo (JP); Yutaro Yamaguchi, Tokyo (JP); Naoki Kosaka, Tokyo (JP); Shinichi Miwa, Tokyo (JP); Koji Yamanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 330 days.

(21) Appl. No.: 13/726,859

(22) Filed: Dec. 26, 2012

(65) Prior Publication Data

US 2014/0019096 A1    Jan. 16, 2014

(30) Foreign Application Priority Data

Jul. 11, 2012    (JP) .................. 2012-155451

(51) Int. Cl.
*G06F 17/50*    (2006.01)
(52) U.S. Cl.
CPC ........ *G06F 17/5068* (2013.01); *G06F 17/5036* (2013.01)
(58) Field of Classification Search
None
See application file for complete search history.

(56) References Cited

U.S. PATENT DOCUMENTS

| 6,772,400 | B2 | 8/2004 | Tsai | |
| 2006/0107246 | A1* | 5/2006 | Nakamura | ........................ 716/5 |

FOREIGN PATENT DOCUMENTS

| JP | 2002-280571 | 9/2002 |
| JP | 2004-501510 | 1/2004 |

OTHER PUBLICATIONS

Crupi et al., "Accurate Multibias Equivalent-Circuit Extraction for GaN HEMTs", IEEE Transactions on Microwave Theory and Techniques, vol. 54, Issue 10, Oct. 2006, pp. 3616-3622.*
Deng et al., "Temperature-Dependent RF Large-Signal Model of GaN-Based MOSHFETs", IEEE Transactions on Microwave Theory and Techniques, vol. 56, Issue 12, Nov. 2008, pp. 2709-2716.*
Liu et al., "Improved large-signal GaN HEMT model suitable for intermodulation distortion analysis", International Journal of Electronics, vol. 98, Issue 12, Dec. 2011, pp. 1673-1685.*
Yoichiro Takayama, "Microwave transistors", Institute of Electronics, Information and Communication Engineers, Dec. 10, 1998, pp. 142-147.

* cited by examiner

*Primary Examiner* — Omar Fernandez Rivas
*Assistant Examiner* — Herng-Der Day
(74) *Attorney, Agent, or Firm* — Oblon, McClelland, Maier & Neustadt, L.L.P.

(57) ABSTRACT

A transistor characteristic calculation apparatus using a large signal equivalent circuit model has a buffer trap circuit provided between a drain terminal and a source terminal such that a parallel circuit including a resistor and a capacitor, a diode, and another parallel circuit including a resistor and a capacitor are in turn connected in series.

5 Claims, 9 Drawing Sheets

FIG.5 indep(PAE_contours_p) (0.000 to 26.000)
IndexPAEff (1.000 to 68.000)

TRANSISTOR CHARACTERISTIC CALCULATION APPARATUS USING LARGE SIGNAL EQUIVALENT CIRCUIT MODEL

BACKGROUND OF THE INVENTION

1. Field of the Invention

The present invention relates to a transistor characteristic calculation apparatus using a large signal equivalent circuit model of a transistor that is used mainly in a VHF band, a UHF band, a microwave band, and a millimeter wave band.

2. Description of Related Art

In order to calculate the characteristics of a transistor, a large signal equivalent circuit model shown in Non-Patent Reference 1 ("Microwave transistors", Yoichiro Takayama, the Institute of Electronics, Information and Communication Engineers, pp. 142-147, Dec. 10, 1998) is used, and the RF characteristics of a small signal and a large signal can be calculated.

The equivalent circuit model is such that the characteristics of the transistor are represented by electrically equivalent circuit elements, and when the representation is used, it is possible to calculate the characteristics on a circuit simulator at a high speed without solving a complicated physical equation.

Figure 11:
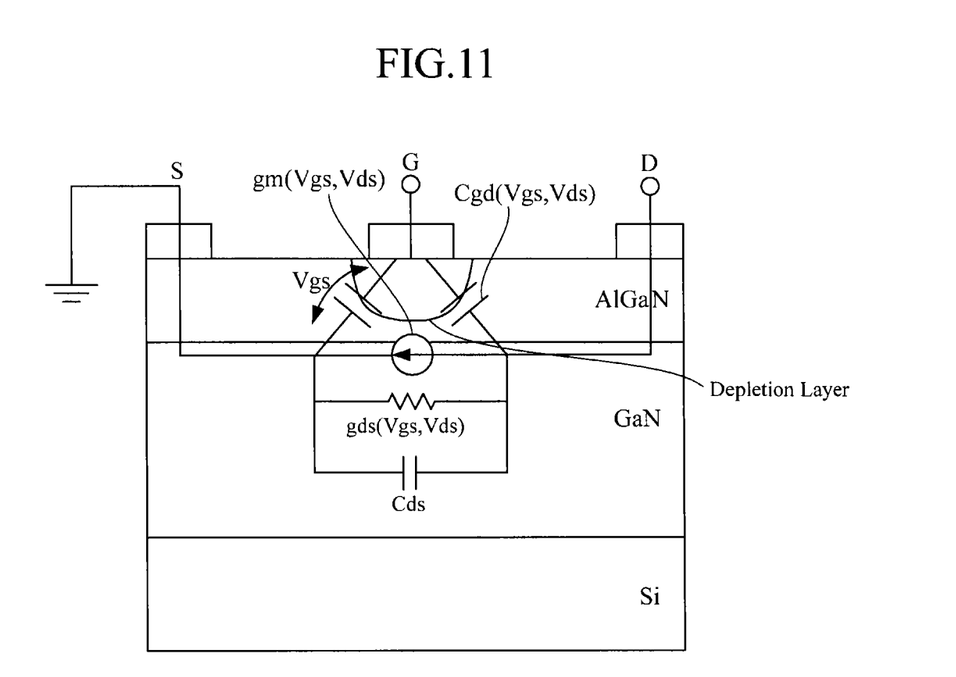
FIG. 11 is an explanatory view showing a correspondence between the physical structure of a conventional transistor and a large signal equivalent circuit model thereof.

FIG. 11 is a view showing a correspondence between the physical structure of a conventional transistor and an equivalent circuit model thereof.

A circuit configuration thereof is basically the same as that of the circuit described in the above Non-Patent Reference 1.

As a model in which the calculation accuracy of the equivalent circuit is improved, a model shown in Patent Reference 1 (Japanese Patent Application Laid-open No. 2002-280571) is also reported.

However, when the above model is applied to a GaN HEMT (High Electron Mobility Transistor) device (especially a GaN HEMT on Si device), there occurs a problem such that calculation accuracy thereof is degraded.

In the case of the GaN HEMT on Si, although GaN is epitaxially grown on an Si substrate, Si and GaN have different lattice constants, and therefore a trap (a fracture capturing an electron) resulting from lattice unconformity occurs at an interface thereof.

The trap has an effect on RF characteristics thereof; however, in the conventional model, such an effect is not considered, which degrades the calculation accuracy.

Figure 12:
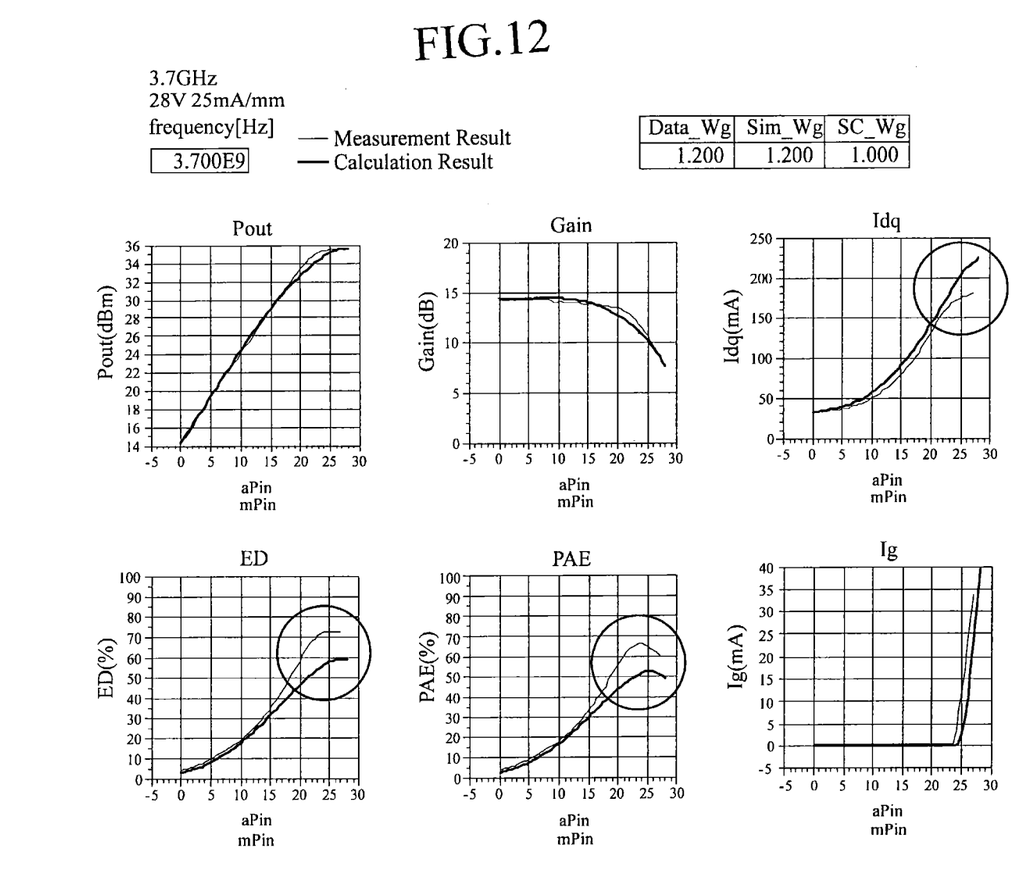
FIG. 12 shows comparison graphs between measurement results and calculation results of the input/output characteristics of the conventional large signal equivalent circuit model.

FIG. 12 shows comparison graphs between measurement results and calculation results in the input/output characteristics of the conventional model.

A thin line indicates the measurement result, while a thick line indicates the calculation result.

It can be seen that with regard to an output power (Pout), a gain (Gain), and a gate current (Ig), the calculation results are approximate to the measurement results and excellent in calculation accuracy, but with regard to a drain current (Idq), a drain efficiency (ED), and a power added efficiency (PAE), the calculation results deviate from the measurement results in the vicinity of the saturation power and poor in calculation accuracy.

Figure 13:
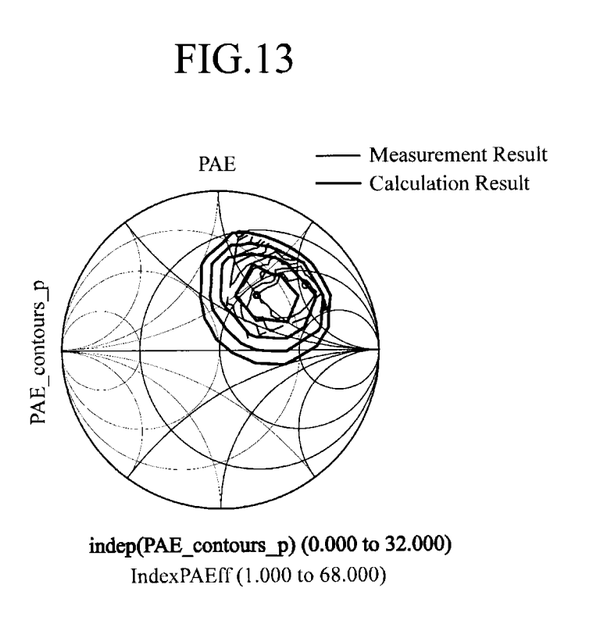
FIG. 13 shows a comparison graph between the measurement result and the calculation result of load pull contours of the conventional large signal equivalent circuit model.

In addition, FIG. 13 shows a comparison graph between the measurement results and the calculation results in conventional load pull contours (contour map of efficiency to impedance).

A thin line indicates the measurement results, and a thick line indicates the calculation results.

It can be seen that the optimum impedances and contours in the measurement results and calculation results are deviated from each other.

As mentioned above, since the effect of the trap is not considered in the conventional model, there is a problem such that the characteristics of the transistor cannot be calculated with high accuracy.

SUMMARY OF THE INVENTION

The present invention is made to solve the aforementioned problems, and an object of the invention is to obtain a transistor characteristic calculation apparatus using a large signal equivalent circuit model that improves the accuracy of calculation in the characteristics of a transistor by taking account of the effect of a trap to thereby improve design accuracy and reduce the number of times in the trial manufacture.

A transistor characteristic calculation apparatus using a large signal equivalent circuit model in the invention has a first trap circuit between a drain terminal and a source terminal such that a first parallel circuit including a first resistor and a first capacitor, a diode, and a second parallel circuit including a second resistor and a second capacitor are in turn connected in series.

According to the invention, since the first trap circuit is provided therein, in consideration of the effect of the trap, the accuracy of calculation in the characteristics of the transistor is improved, thereby improving design accuracy thereof and reducing the number of times in the trial manufacture.

DETAILED DESCRIPTION OF THE PREFERRED EMBODIMENTS

Figure 1:
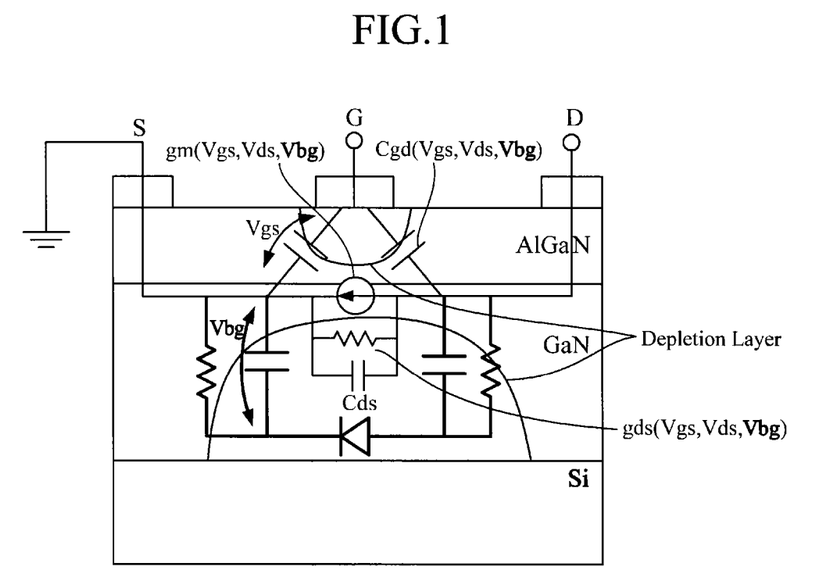
FIG. 1 is an explanatory view showing a correspondence between the physical structure of a transistor and a large signal equivalent circuit model in the present invention.

In the following, embodiments of the present invention will be described with reference to the attached drawings.
First Embodiment FIG. 1 shows a corresponding view between the physical structure of a transistor in the present invention and an equivalent circuit model taking account of a trap.

A circuit portion of a thick line is a circuit representing the trap and a simple circuit composed of only resistors, capacitors, and a diode.

It is possible to take account of an effect of the trap in such a manner that the present circuit is incorporated into a large signal equivalent circuit model to thereby feed back the potential of Vbg to gm, Cgd, and gds.

Next, a description will be given of an operation of the equivalent circuit model taking account of the trap.

Figure 2:
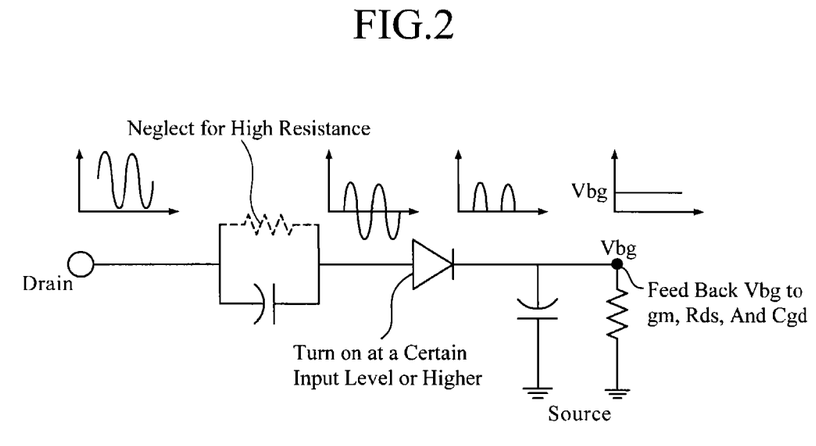
FIG. 2 is an explanatory view showing an effect by a trap circuit in the large signal equivalent circuit model in the invention.

For a plain explanation, FIG. 2 shows a view in which only the trap circuit is taken out from the large signal equivalent circuit model.

The voltage of a drain terminal is assumed to change in a sinusoidal waveform.

In the case where the resistance is assumed to be sufficiently high as compared with the impedance of the capacitor and neglected, the input voltage of the diode has a waveform in which a direct current component is cut as shown in the drawing.

When the operation of the transistor is nearly saturated and the amplitude of the drain voltage is increased, the amplitude of the voltage exceeds the threshold voltage of the diode, and therefore the diode is turned ON.

In that case, the waveform passing through the diode has a half-wave rectification waveform, and a high frequency component is cut in the subsequent capacitor, so that the potential of Vbg has a smoothed direct current, as shown in the drawing.

Thus, the present trap circuit operates as a type of detector circuit that changes an RF voltage into a DC voltage.

When the potential of the resultant Vbg is fed back to gm, Cgd, and gds, and their parameters are changed with Vbg, the effect of the trap can be introduced in the calculation.

In this manner, it is possible to improve the calculation accuracy of the transistor characteristics in the vicinity of a saturation power thereof.

Detailed calculation results will be indicated in the following description in the first embodiment.

Figure 3:
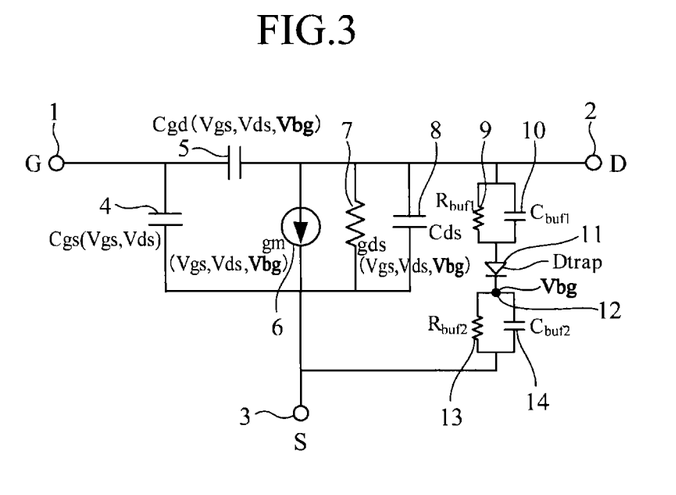
FIG. 3 is an equivalent circuit diagram showing a large signal equivalent circuit model applied to a transistor characteristic calculation apparatus according to a first embodiment in the invention.

FIG. 3 is an equivalent circuit diagram showing a large signal equivalent circuit model applied to a transistor characteristic calculation apparatus according to the first embodiment in the invention.

In the drawing, there are provided a gate terminal 1, a drain terminal 2, and a source terminal 3 of an FET.

A gate-to-source capacitance (Cgs) 4 is connected between the gate terminal 1 and the source terminal 3, and a gate-to-drain capacitance (Cgd) 5 is connected between the gate terminal 1 and the drain terminal 2.

A transconductance (gm) 6, a drain conductance (gds) 7, and a drain-to-source capacitance (Cds) 8 are connected in parallel between the drain terminal 2 and the source terminal 3.

A buffer trap circuit is connected between the drain terminal 2 and the source terminal 3 in parallel with the transconductance (gm) 6, the drain conductance (gds) 7, and the drain-to-source capacitance (Cds) 8.

It is noted that the trap is roughly divided into a buffer side one and a surface side one.

Third and fourth embodiments described later are aimed at the surface side trap, while the first embodiment is aimed at the buffer side trap; thus, in order to differentiate between them, the circuit is referred to as the buffer trap circuit in the first embodiment.

In the buffer trap circuit, a parallel circuit including a resistor ($R_{buf1}$) 9 and a capacitor ($C_{buf1}$) 10, a diode 11, and a parallel circuit including a resistor ($R_{buf2}$) 13 and a capacitor ($C_{buf2}$) 14 are in turn connected in series.

The diode 11 is connected from the resistor ($R_{buf1}$) 9 side toward the resistor ($R_{buf2}$) 13 side in forward polarity.

A potential (Vbg) 12 at the connection point between the cathode of the diode 11 and the parallel circuit including the resistor ($R_{buf2}$) 13 and the capacitor ($C_{buf2}$) 14 corresponds to the potential of the charges accumulated in the buffer trap circuit.

Incidentally, although the transistor characteristic calculation apparatus, namely a circuit simulator, is not shown in the drawing, it is assumed that software stored in hardware is constituted by, for example, a computer that makes a simulation for the large signal equivalent circuit model shown in FIG. 3.

Next, an operation thereof will be described.

When RF power is inputted to the gate terminal 1, a drain current flows corresponding to the voltage applied to the gate terminal 1.

A matching load is normally connected to the drain terminal, and therefore, when the drain current flows, a drain voltage changes correspondingly.

As mentioned above, as the amplitude of the drain voltage becomes a certain value or higher, the diode 11 of the buffer trap circuit is turned ON, charges are accumulated in the buffer trap circuit, so that the potential 12 of Vbg is increased.

The potential (Vbg) 12 is fed back to gm, gds, and Cgd to thereby change the values of the respective parameters.

Hereupon, as a method for the feedback, for example, the following equations are used.

$$gm = \frac{\partial I_{ds}}{\partial V_{gs}}, I_{ds}(V_{gs}, V_{ds}, V_{bg}) = f(V_{gs} - kV_{bg}, V_{ds})$$

$$C_{gd}(V_{gs}, V_{ds}, V_{bg}) =$$

$$m(V_{bg}) \cdot g(V_{gs}, V_{ds}) = (1 - (1 - M_1)\tanh(m_{bg} * V_{bg})) \cdot g(V_{gs}, V_{ds})$$

$$g_{ds} = \frac{1}{R_{ds}}, R_{ds}(V_{gs}, V_{ds}, V_{bg}) =$$

$$n(V_{bg}) \cdot h(V_{gs}, V_{ds}) = (1 + N_1 \tanh(n_{bg} * V_{bg})) \cdot h(V_{gs}, V_{ds})$$

where f (x, y), g (x, y), and h (x, y) are model equations of individual transistor models, and are changed in accordance with the model; k, $M_1$, $m_{bg}$, $N_1$, and $n_{bg}$ are parameters of the present trap circuit.

Figure 4:
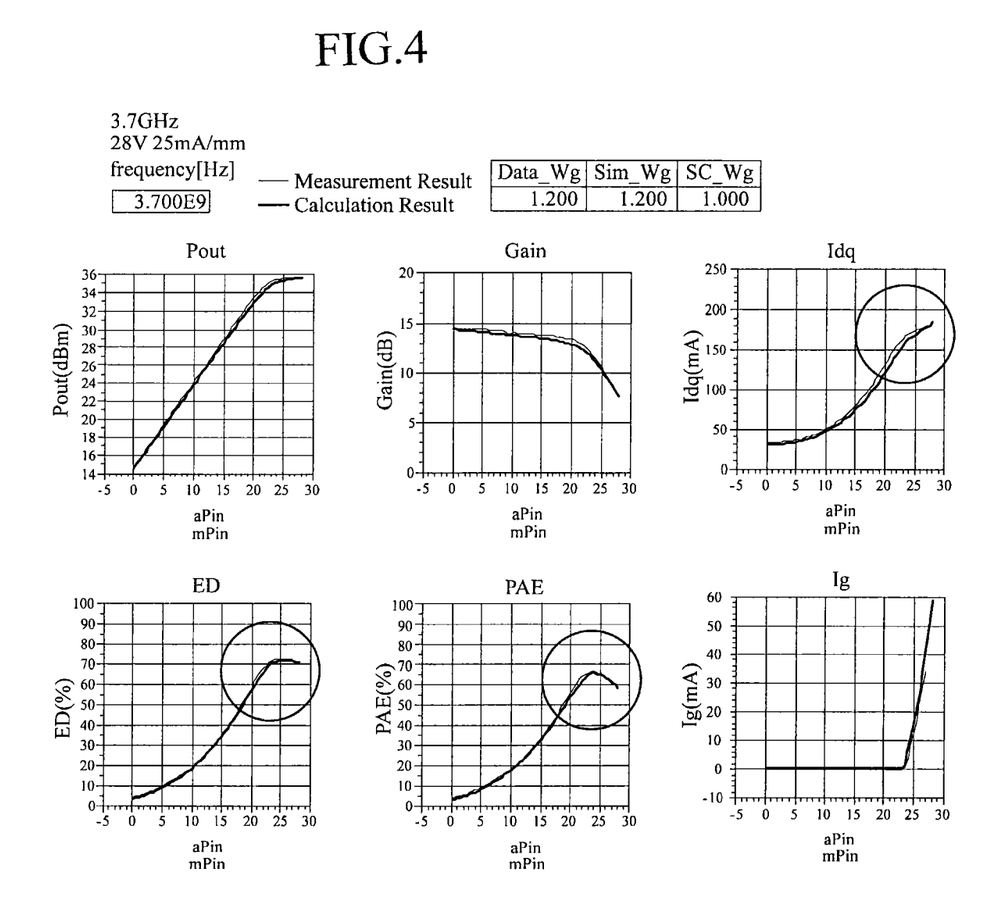
FIG. 4 shows comparison graphs between measurement results and calculation results of the input/output characteristics of the large signal equivalent circuit model according to the first embodiment in the invention.

FIG. 4 shows comparison graphs between measurement results and calculation results of the input/output characteristics according to the model in the first embodiment:

f=3.7 GHz, Vds=30 V, and Vgs=−2 are satisfied, a thin line is the measurement result, and a thick line is the calculation result.

It can be seen that the calculation results are excellent in the vicinity of a saturation power thereof even in a drain current (Idq), drain efficiency (ED), and power added efficiency (PAE), in addition to an output power (Pout), a gain (Gain), and a gate current (Ig), so that the measurement results and the calculation results agree well with each other.

This is because the present trap circuit operates in a region where a power level is high.

Figure 5:
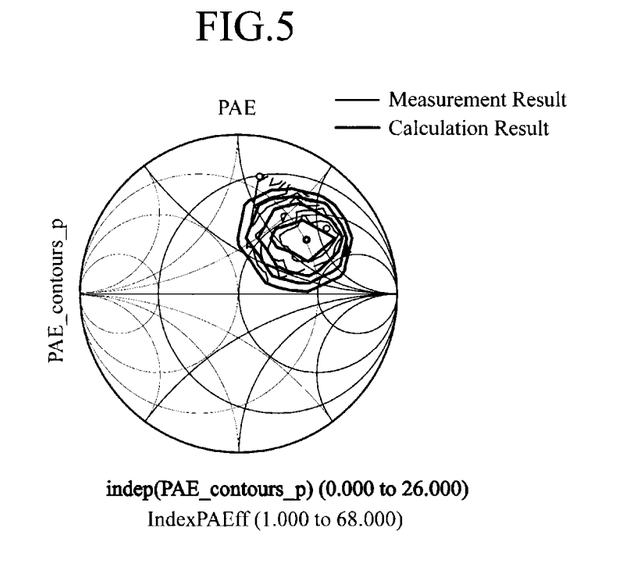
FIG. 5 shows a comparison graph between measurement results and calculation results of load pull contours of the large signal equivalent circuit model according to the first embodiment in the invention.

In addition, FIG. 5 shows a comparison graph between measurement results and calculation results of load pull contours in the first embodiment.

A thin line is the measurement result, and a thick line is the calculation result.

The individual lines in the drawing indicate contours of the power added efficiency.

It can be seen that the measurement results and the calculation results agree well with each other.

With the present model, it is also possible to calculate an optimum load with high accuracy.

As described above, according to the first embodiment, since there is provided the buffer trap circuit which is connected between the drain terminal 2 and the source terminal 3, and in which the parallel circuit including the resistor ($R_{buf1}$) 9 and the capacitor ($C_{buf1}$) 10, the diode 11, and the parallel circuit including the resistor ($R_{buf2}$) 13 and the capacitor ($C_{buf2}$) 14 are in turn connected in series, in consideration of the effect of the buffer trap, it is possible to improve the accuracy of calculation in the characteristics of the transistor to thereby improve design accuracy thereof and reduce the number of times in the trial manufacture.

Second Embodiment

Figure 6:
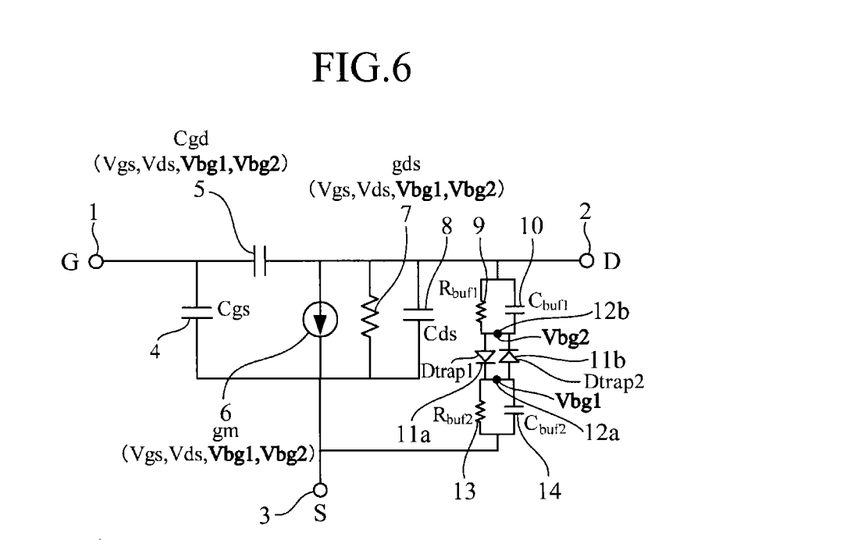
FIG. 6 is an equivalent circuit diagram showing a large signal equivalent circuit model applied to a transistor characteristic calculation apparatus according to a second embodiment in the invention.

FIG. 6 is an equivalent circuit diagram showing a large signal equivalent circuit model applied to a transistor characteristic calculation apparatus according to a second embodiment in the invention.

In the drawing, in a buffer trap circuit, between a parallel circuit including a resistor ($R_{buf1}$) 9 and a capacitor ($C_{buf1}$) 10 and a parallel circuit including a resistor ($R_{buf2}$) 13 and a capacitor ($C_{buf2}$) 14, a diode 11a is connected from the resistor ($R_{buf1}$) 9 side toward the resistor ($R_{buf2}$) 13 side in forward polarity, and a diode 11b is connected from the resistor ($R_{buf1}$) 9 side toward the resistor ($R_{buf2}$) 13 side in opposite polarity and in parallel with the diode 11a.

A potential (Vbg1) 12a at the connection point between the cathode of the diode 11a or the anode of the diode 11b, and the parallel circuit including the resistor ($R_{buf2}$) 13 and the capacitor ($C_{buf2}$) 14 corresponds to the potential of the charges accumulated in the buffer trap circuit.

In addition, a potential (Vbg2) 12b at the connection point between the parallel circuit including the resistor ($R_{buf1}$) 9 and the capacitor ($C_{buf1}$) 10 and the anode of the diode 11a or the cathode of the diode 11b corresponds to the potential of charges accumulated in the buffer trap circuit.

The other configuration is the same as that of FIG. 3.

Next, an operation thereof will be described.

The operation is substantially the same as that in the first embodiment.

However, the second embodiment is different from the first embodiment in that the two diodes 11a and 11b are provided in the buffer trap circuit, and that the two potentials Vbg1 and Vbg2 are fed back to gm, gds, and Cgd.

This is because the symmetry of the transistor is taken into consideration.

As can be seen from the cross-sectional view of the transistor shown in FIG. 1, the drain electrode and the source electrode of the transistor are in principle configured symmetric, and even when a voltage is reversely applied to the source electrode and the drain electrode, the transistor operates.

Therefore, the model of the transistor should be also symmetric between the drain and the source.

In the second embodiment, the above point is taken into consideration.

The buffer trap circuit in the second embodiment is constituted symmetric between the drain and the source.

In the caase where a positive voltage is applied between the drain and the source, only the diode 11a operates, and in the case where a negative voltage is applied therebetween, only the diode 11b operates.

In each of the cases, the potentials Vbg1 and Vbg2 of the charges to be accumulated are fed back to thereby change the parameters of the equivalent circuit.

In this manner, the effect of the trap can be introduced into the model.

As described above, according to the second embodiment, since there is provided the buffer trap circuit in which, between the parallel circuit including the resistor ($R_{buf1}$) 9 and the capacitor ($C_{buf1}$) 10 and the parallel circuit including the resistor ($R_{buf2}$) 13 and the capacitor ($C_{buf2}$) 14, the diode 11a is connected from the resistor ($R_{buf1}$) 9 side toward the resistor ($R_{buf2}$) 13 side in forward polarity, and the diode 11b is connected from the resistor ($R_{buf1}$) 9 side toward the resistor ($R_{buf2}$) 13 side in opposite polarity and in parallel with the diode 11a, in addition to the above first embodiment, it is possible to introduce into the model the symmetry between the drain and the source of the transistor.

Third Embodiment

Figure 7:
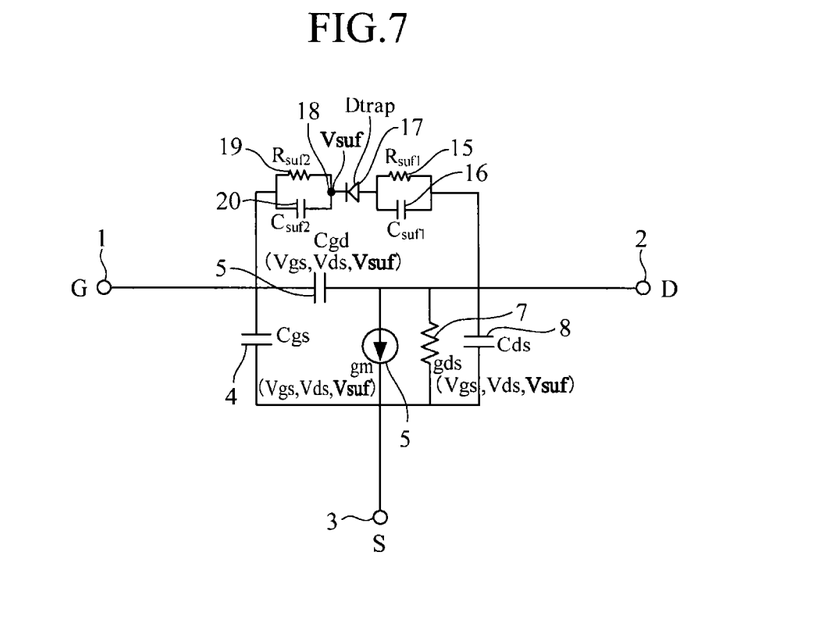
FIG. 7 is an equivalent circuit diagram showing a large signal equivalent circuit model applied to a transistor characteristic calculation apparatus according to a third embodiment in the invention.

FIG. 7 is an equivalent circuit diagram showing a large signal equivalent circuit model applied to a transistor characteristic calculation apparatus according to a third embodiment in the invention.

In the drawing, a surface trap circuit is connected between the drain terminal 2 and the gate terminal 1 in parallel with the gate-to-drain capacitor (Cgd) 5.

It is noted that the above first and second embodiments are aimed at the buffer side trap, while the third embodiment is aimed at the surface side trap; thus, in order to differentiate between them, the circuit is referred to as the surface trap circuit in the third embodiment.

In the surface trap circuit, a parallel circuit including a resistor ($R_{suf1}$) 15 and a capacitor ($C_{suf1}$) 16, a diode 17, and a parallel circuit including a resistor ($R_{suf2}$) 19 and a capacitor ($C_{suf2}$) 20 are in turn connected in series.

The diode 17 is connected from the resistor ($R_{suf1}$) 15 side toward the resistor ($R_{suf2}$) 19 side in forward polarity.

A potential (Vsuf) 18 at the connection point between the cathode of the diode 17 and the parallel circuit including the resistor ($R_{suf2}$) 19 and the capacitor ($C_{suf2}$) 20 corresponds to the potential of the charges accumulated in the surface trap circuit.

The other configuration is the same as that of FIG. 3 except that a buffer trap circuit is not provided.

Next, an operation thereof will be described.

Although the surface trap circuit is provided between the gate and the drain, the operation thereof is substantially the same as that in the first embodiment.

When the gate-to-drain voltage is represented by Vdg, Vdg=Vds−Vgs is satisfied. This is because, for example, when Vds=30 V and Vgs=−2 V are satisfied, Vdg=32 V and Vds≅Vdg are satisfied.

According to the third embodiment, it is possible to perform a calculation taking account of the trap on the surface side.

As described above, according to the third embodiment, since there is provided the surface trap circuit which is connected between the drain terminal 2 and the gate terminal 1, and in which the parallel circuit including the resistor ($R_{suf1}$) 15 and the capacitor ($C_{suf1}$) 16, the diode 17, and the parallel circuit including the resistor ($R_{suf2}$) 19 and the capacitor ($C_{suf2}$) 20 are in turn connected in series, in consideration of the effect of the surface trap, it is possible to improve the accuracy of calculation in the characteristics of the transistor to thereby improve the accuracy of design thereof and reduce the number of times in the trial manufacture.

Fourth Embodiment

Figure 8:
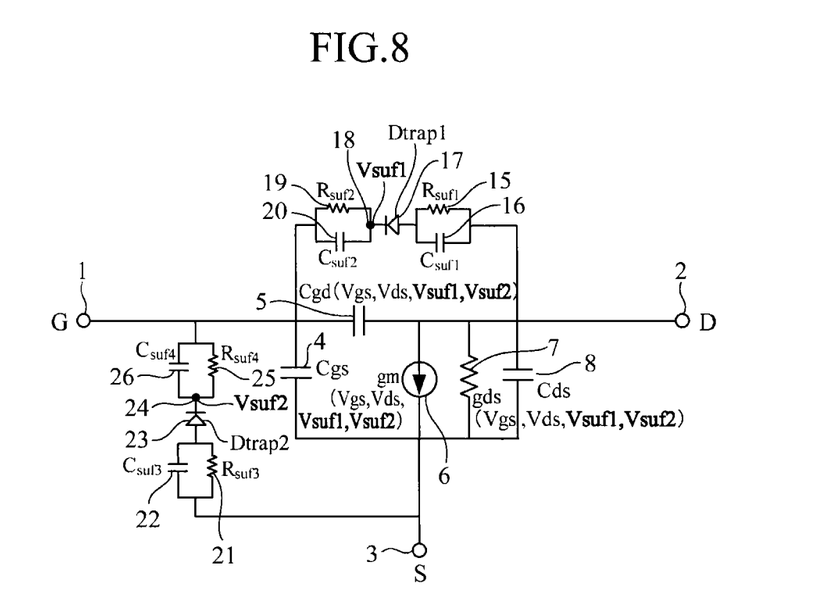
FIG. 8 is an equivalent circuit diagram showing a large signal equivalent circuit model applied to a transistor characteristic calculation apparatus according to a fourth embodiment in the invention.

FIG. 8 is an equivalent circuit diagram showing a large signal equivalent circuit model applied to a transistor characteristic calculation apparatus according to a fourth embodiment in the invention.

In the drawing, a surface trap circuit is connected between a source terminal 3 and a gate terminal 1 in parallel with a gate-source capacitor (Cgs) 4.

In the surface trap circuit, a parallel circuit including a resistor ($R_{suf3}$) 21 and a capacitor ($C_{suf3}$) 22, a diode 23, and a parallel circuit including a resistor ($R_{suf4}$) 25 and a capacitor ($C_{suf4}$) 26 are in turn connected in series.

The diode 23 is connected from the resistor ($R_{suf3}$) 21 side toward the resistor ($R_{suf4}$) 25 side in forward polarity.

A potential (Vsuf2) 24 at the connection point between the cathode of the diode 23 and the parallel circuit including the resistor ($R_{suf4}$) 25 and the capacitor ($C_{suf4}$) 26 corresponds to the potential of the charges accumulated in the surface trap circuit.

It is noted that in the fourth embodiment, the potential 18 at the connection point between the cathode of the diode 17 capacitor ($C_{suf2}$) 20 is represented by Vsuf1.

The other configuration is the same as that of FIG. 7.

Next, an operation thereof will be described.

As mentioned above, since the drain electrode and the source electrode of the transistor are symmetric to the gate electrode, the portion between the gate and the drain and the one between the gate and the source is constituted by a symmetric structure.

The symmetry is taken into consideration in the fourth embodiment, and the surface trap circuits are provided between the gate and the drain, and between the gate and the source.

In this manner, it is also possible to cope with the operation in the case where a voltage (negative voltage) opposite to a normal voltage is applied to the drain electrode and the source electrode.

The fourth embodiment is different from the second embodiment in that Vsuf1 and Vsuf2 are fed back instead of Vbg1 and Vbg2, but the operation thereof is substantially the same as that in the second embodiment.

When the fourth embodiment is used, it is possible to perform a calculation taking account of the surface trap between the gate and the drain, and the one between the gate and the source.

As described above, according to the fourth embodiment, since there are provided: the surface trap circuit which is connected between the drain terminal 2 and the gate terminal 1, and in which the parallel circuit including the resistor ($R_{suf1}$) 15 and the capacitor ($C_{suf1}$) 16, the diode 17, and the parallel circuit including the resistor ($R_{suf2}$) 19 and the capacitor ($C_{suf2}$) 20 are in turn connected in series; and the surface trap circuit which is connected between the source terminal 3 and the gate terminal 1, and in which the parallel circuit including the resistor ($R_{suf3}$) 21 and the capacitor ($C_{suf3}$) 22, the diode 23, and the parallel circuit including the resistor ($R_{suf4}$) 25 and the capacitor ($C_{suf4}$) 26 are in turn connected in series, in consideration of the effects of the surface trap between the gate and the drain and the one between the gate and the source, it is possible to improve the accuracy of calculation in the characteristics of the transistor to thereby improve design accuracy thereof and reduce the number of times in the trial manufacture.

Fifth Embodiment

Figure 9:
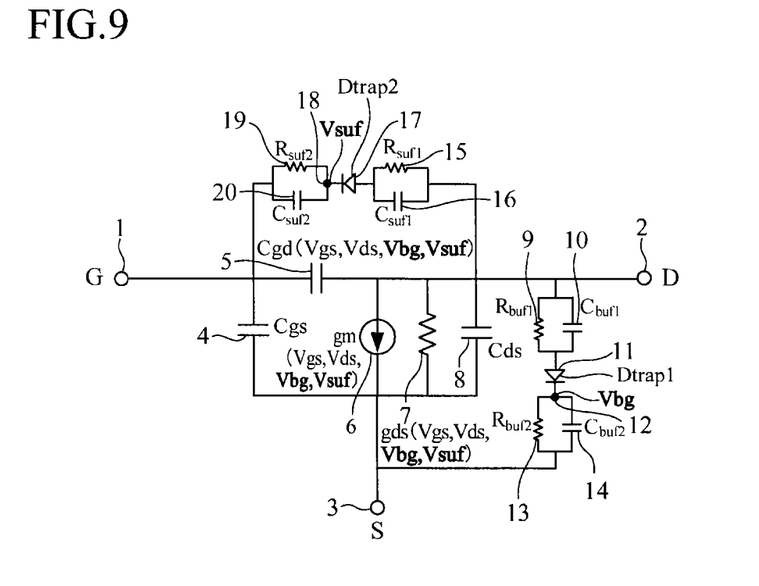
FIG. 9 is an equivalent circuit diagram showing a large signal equivalent circuit model applied to a transistor characteristic calculation apparatus according to a fifth embodiment in the invention.

FIG. 9 is an equivalent circuit diagram showing a large signal equivalent circuit model applied to a transistor characteristic calculation apparatus according to a fifth embodiment in the invention.

In the drawing, the buffer trap circuit shown in the first embodiment (FIG. 3) is added to the surface trap circuit shown in the second embodiment (FIG. 7).

Next, an operation thereof will be described.

In the fifth embodiment, it is possible to take account of both of the surface trap and the buffer trap.

As mentioned above, in the operation, the effect of the trap is taken into consideration in such a manner that the surface potential (Vsuf) 18 and the buffer potential (Vbg) 12 each are fed back.

With the fifth embodiment, it is possible to cope with even a case where the trap is present in each of the surface and the buffer.

As described above, according to the fifth embodiment, since there are provided: the surface trap circuit which is connected between the drain terminal 2 and the gate terminal 1, and in which the parallel circuit including the resistor ($R_{suf1}$) 15 and the capacitor ($C_{suf1}$) 16, the diode 17, and the parallel circuit including the resistor ($R_{suf2}$) 19 and the capacitor ($C_{suf2}$) 20 are in turn connected in series; and the buffer trap circuit which is connected between the drain terminal 2 and the source terminal 3, and in which the parallel circuit including the resistor ($R_{buf1}$) 9 and the capacitor ($C_{buf1}$) 10, the diode 11, and the parallel circuit including the resistor ($R_{buf2}$) 13 and the capacitor ($C_{buf2}$) 14 are in turn connected in series, in consideration of both of the effects of the surface trap between the gate and the drain, and the buffer trap, it is possible to improve the accuracy of calculation in the characteristics of the transistor to thereby improve design accuracy and reduce the number of times in trial manufacture.

Sixth Embodiment

Figure 10:
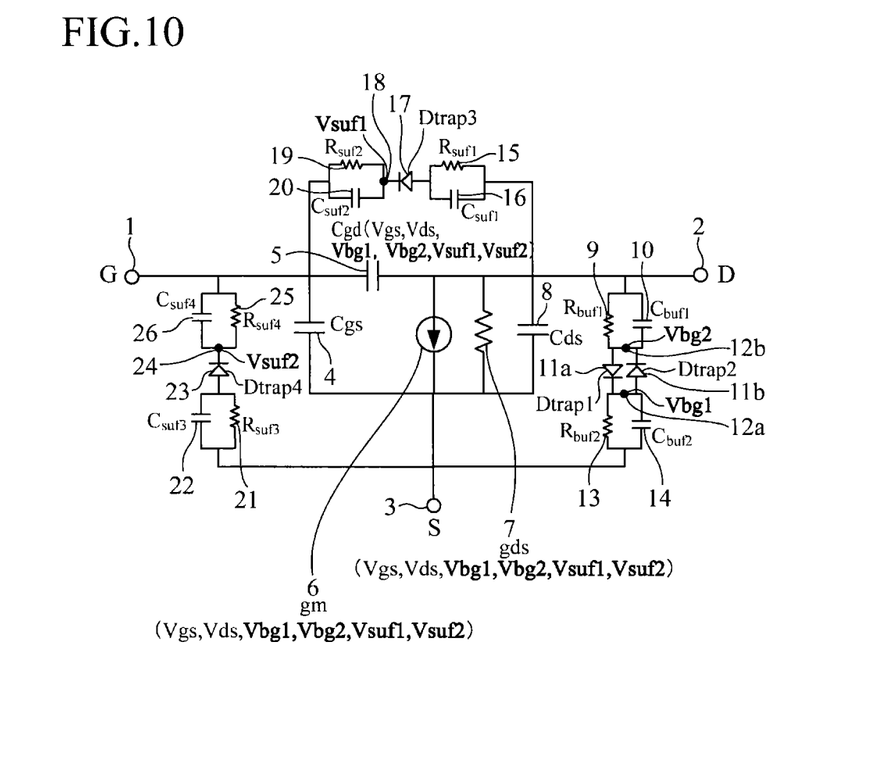
FIG. 10 is an equivalent circuit diagram showing a large signal equivalent circuit model applied to a transistor characteristic calculation apparatus according to a sixth embodiment in the invention.

FIG. 10 is an equivalent circuit diagram showing a large signal equivalent circuit model applied to a transistor characteristic calculation apparatus according to a sixth embodiment in the invention.

In the drawing, the buffer trap circuit shown in the above second embodiment (FIG. 6) is added to the surface trap circuit shown in the above fourth embodiment (FIG. 8).

Next, an operation thereof will be described.

The sixth embodiment is a model capable of calculating the effects of the surface trap and the buffer trap with taking account of the symmetry of the transistor.

An operation thereof is the same principle described in the above embodiments.

However, four potentials of surface potentials (Vsuf1) 18 and (Vsuf2) 24 and buffer potentials (Vbg1) 12a and (Vbg2) 12b are fed back thereto.

According to the sixth embodiment, it is possible to apply the present model to a device that causes the transistor to perform a symmetric operation such as a switch.

As described above, according to the sixth embodiment, since there are provided: the surface trap circuit which is connected between the drain terminal 2 and the gate terminal 1, and in which the parallel circuit including the resistor ($R_{suf1}$) 15 and the capacitor ($C_{suf1}$) 16, the diode 17 and the parallel circuit including the resistor ($R_{suf2}$) 19 and the capacitor ($C_{suf2}$) 20 are in turn connected in series; the surface trap circuit which is connected between the source terminal 3 and the gate terminal 1 and in which the parallel circuit including the resistor ($R_{suf3}$) 21 and the capacitor ($C_{suf3}$) 22, the diode 23, and the parallel circuit including the resistor ($R_{suf4}$) 25 and the capacitor ($C_{suf4}$) 26 are in turn connected in series; and the buffer trap circuit which is connected between the drain terminal 2 and the source terminal 3 and in which the parallel circuit including the resistor ($R_{buf1}$) 9 and the capacitor ($C_{buf1}$) 10, the parallel circuit including the diodes 11a and 11b, and the parallel circuit including the resistor ($R_{buf2}$) 13 and the capacitor ($C_{buf2}$) 14 are in turn connected in series, in consideration of the effects of the surface trap between the gate and the drain, the surface trap between the gate and the source, and the buffer trap, it is possible to improve the accuracy of calculation in the characteristics of the transistor to thereby improve design accuracy thereof and reduce the number of times in the trial manufacture.

Although the present invention is the model of the intrinsic part of the transistor, it is also possible to produce a model in which a parasitic component is taken into consideration by combining a parasitic part with the present model.

It is noted that in the invention, it is possible to freely combine the embodiments, modify any component of the embodiments, or omit any component in the embodiments within the scope of the invention.

What is claimed is:

1. A transistor characteristic calculation apparatus using a large signal equivalent circuit model, comprising:
    a gate-to-source capacitance connected between a gate terminal and a source terminal;
    a gate-to-drain capacitance connected between the gate terminal and a drain terminal;
    a parallel circuit connected between the drain terminal and the source terminal and including a transconductance, a drain conductance, and a drain-to-source capacitance; and
    a first trap circuit connected between the drain terminal and the source terminal,
    wherein the first trap circuit is configured such that a first parallel circuit including a first resistor and a first capacitor, a diode, and a second parallel circuit including a second resistor and a second capacitor are in turn connected in series.

2. The transistor characteristic calculation apparatus using a large signal equivalent circuit model according to claim 1, wherein the first trap circuit includes a first diode connected between the first parallel circuit and the second parallel circuit in forward polarity, and a second diode connected between the first parallel circuit and the second parallel circuit in opposite polarity and in parallel with the first diode.

3. A transistor characteristic calculation apparatus using a large signal equivalent circuit model, comprising:
    a gate-to-source capacitance connected between a gate terminal and a source terminal;
    a gate-to-drain capacitance connected between the gate terminal and a drain terminal;
    a parallel circuit connected between the drain terminal and the source terminal and including a transconductance, a drain conductance, and a drain-to-source capacitance; and
    a second trap circuit connected between the drain terminal and the gate terminal,
    wherein the second trap circuit is configured such that a third parallel circuit including a third resistor and a third capacitor, a diode, and a fourth parallel circuit including a fourth resistor and a fourth capacitor are in turn connected in series.

4. The transistor characteristic calculation apparatus using a large signal equivalent circuit model according to claim 3, further comprising:
    a third trap circuit connected between the source terminal and the gate terminal,
    wherein the third trap circuit is configured such that a fifth parallel circuit including a fifth resistor and a fifth capacitor, a diode, and a sixth parallel circuit including a sixth resistor and a sixth capacitor are in turn connected in series.

5. The transistor characteristic calculation apparatus using a large signal equivalent circuit model according to claim 3, further comprising:
    a first trap circuit connected between the drain terminal and the source terminal,
    wherein the first trap circuit is configured such that a first parallel circuit including a first resistor and a first capacitor, a diode, and a second parallel circuit including a second resistor and a second capacitor are in turn connected in series.

* * * * *